United States Patent
Van Bokhoven et al.

(10) Patent No.: US 10,281,830 B2
(45) Date of Patent: May 7, 2019

(54) PATTERNING DEVICE COOLING SYSTEMS IN A LITHOGRAPHIC APPARATUS

(71) Applicants: ASML Netherlands B.V., Veldhoven (NL); ASML Holding N.V., Veldhoven (NL)

(72) Inventors: Laurentius Johannes Adrianus Van Bokhoven, Veldhoven (NL); Christopher Charles Ward, Kensington, CA (US); Marc Léon Van Der Gaag, Rheden (NL); Johan Gertrudis Cornelis Kunnen, Weert (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 15/742,179

(22) PCT Filed: Jun. 17, 2016

(86) PCT No.: PCT/EP2016/063984
§ 371 (c)(1),
(2) Date: Jan. 5, 2018

(87) PCT Pub. No.: WO2017/008996
PCT Pub. Date: Jan. 19, 2017

(65) Prior Publication Data
US 2018/0196360 A1    Jul. 12, 2018

Related U.S. Application Data

(60) Provisional application No. 62/192,347, filed on Jul. 14, 2015.

(51) Int. Cl.
    *G03F 7/20*    (2006.01)

(52) U.S. Cl.
    CPC ...... *G03F 7/70875* (2013.01); *G03F 7/70733* (2013.01); *G03F 7/70783* (2013.01); *G03F 7/70858* (2013.01); *G03F 7/70891* (2013.01)

(58) Field of Classification Search
    CPC ............. G03F 7/70773; G03F 7/70783; G03F 7/70858; G03F 7/70875; G03F 7/70891
    (Continued)

(56) References Cited

U.S. PATENT DOCUMENTS 5,581,324 A * 12/1996 Miyai ................. G03F 7/70258
                                                    355/53
8,647,797 B2    2/2014 Ishii et al.
(Continued)

FOREIGN PATENT DOCUMENTS

JP    H06-349700 A    12/1994
JP    H07-147224 A    6/1995
(Continued)

OTHER PUBLICATIONS

International Search Report and Written Opinion of the International Searching Authority directed to related International Patent Application No. PCT/EP2016/063984, dated Sep. 27, 2016; 18 pages.
(Continued)

*Primary Examiner* — Colin W Kreutzer
(74) *Attorney, Agent, or Firm* — Sterne, Kessler, Goldstein & Fox P.L.L.C.

(57) ABSTRACT

A lithographic apparatus (100) includes a patterning device support structure (104) configured to support a patterning device (110), a gas inlet (116) configured to provide a gas flow (114) across a surface of the patterning device, and a temperature conditioning device (134) configured to condition the temperature of the gas flow based on a set point. The apparatus also includes a sensor (132) configured to measure
(Continued)

a parameter indicative of an amount of heat added to at least one of the patterning device and a volume (126) between the patterning device and a lens (124) of a projection system (106) during operational use of the lithographic system. Further, the apparatus includes a controller (130) operatively coupled to the sensor and configured to adjust the set point based on the parameter measured by the sensor to control a temperature of the patterning device.

18 Claims, 9 Drawing Sheets

(58) Field of Classification Search
USPC .......................................... 355/30, 67, 72, 77
See application file for complete search history.

(56) References Cited

U.S. PATENT DOCUMENTS

| | | | |
|---|---|---|---|
| 2002/0112784 A1 | 8/2002 | Tanaka et al. | |
| 2006/0256305 A1 | 11/2006 | Won | |
| 2009/0195787 A1* | 8/2009 | Granados | G03F 7/70875 |
| | | | 356/509 |
| 2012/0133914 A1* | 5/2012 | Prosyentsov | G03F 1/44 |
| | | | 355/53 |
| 2012/0141928 A1 | 6/2012 | Ishii et al. | |
| 2015/0168854 A1 | 6/2015 | Westerlaken et al. | |
| 2015/0241796 A1 | 8/2015 | Ebert, Jr. et al. | |

FOREIGN PATENT DOCUMENTS

| | | |
|---|---|---|
| JP | H08-288206 A | 11/1996 |
| JP | H09-92613 A | 4/1997 |
| JP | H10-289874 A | 10/1998 |
| JP | 2002-359178 A | 12/2002 |
| JP | 2003-222991 A | 8/2003 |
| JP | 2013-502063 A | 1/2013 |
| JP | 2015-536476 A | 12/2015 |
| WO | WO 2014/067802 A1 | 5/2014 |

OTHER PUBLICATIONS

International Preliminary Report on Patentability directed to related International Patent Application No. PCT/EP2016/063984, dated Jan. 16, 2018; 9 pages.

* cited by examiner

PATTERNING DEVICE COOLING SYSTEMS IN A LITHOGRAPHIC APPARATUS

CROSS-REFERENCE TO RELATED APPLICATIONS

This application claims priority of U.S. Application No. 62/192,347, which was filed on Jul. 14, 2015, which is incorporated herein in its entirety by reference.

FIELD

The present disclosure relates to a system and method for controlling temperature of an object, for example, a patterning device in a lithographic apparatus, by flowing gas across a surface of the object.

BACKGROUND

A lithographic apparatus is a machine that applies a desired pattern onto a substrate, usually onto a target portion of the substrate. A lithographic apparatus can be used, for example, to manufacture integrated circuits (ICs). In such a case, a patterning device, for example, a mask or a reticle, can generate a circuit pattern to be formed on an individual layer of the IC. This pattern can be transferred onto a target portion (for example, including part of, one, or several dies) on a substrate (for example, a silicon wafer). Transfer of the pattern is typically via imaging onto a layer of radiation-sensitive material (resist) provided on the substrate. Generally, a single substrate will contain a network of adjacent target portions that are successively patterned. Conventional lithographic apparatuses include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, the radiation beam may cause thermal effects (e.g., thermal expansion) in the patterning device. The patterning device may comprise a base material, for example, fused silica, that is substantially transparent to radiation, for example, deep ultraviolet radiation, and may comprise a pattern made of a substantially non-transparent material, for example, chrome. The thermal effects may be due to absorption of radiation beam by non-transparent portions of the patterning device and may cause, for example, alignment errors and/or overlay errors in the patterns formed on the substrate. The radiation beam or convection from the heated patterning device may also heat the air between the patterning device and proximal lens elements. Such heated air between the pattering device and the lens elements may cause image distortion (such as overlay errors). To correct these errors due to thermal expansion of the patterning device and/or heating of the air between the pattering device and the lens elements, current lithographic apparatus may rely on correction systems. For example, such a correction system can include a reticle or wafer alignment system, a magnification correction system, a feed forward system for expansion prediction, a lens correction system, or a combination thereof. However, with the continuing trend towards scaling down of device dimensions, these correction systems may not provide the desired level of alignment and/or overlay accuracy that may be needed for the development of these scaled down devices.

SUMMARY

Accordingly, in some embodiments, a system and method controls the temperature of a patterning device in a lithographic apparatus.

In some embodiments, a lithographic apparatus includes a patterning device support structure configured to support a patterning device, a gas inlet configured to provide a gas flow across a surface of the patterning device, and a temperature conditioning device configured to condition the temperature of the gas flow based on a set point. The apparatus also includes at least one sensor configured to measure a parameter indicative of an amount of heat added to the patterning device and a volume between the patterning device and a lens of a projection system during operational use of the lithographic system. Further, the apparatus includes a controller operatively coupled to the at least one sensor and configured to adjust the set point based on the parameter measured by the sensor to control a temperature of the patterning device. In some embodiments, the parameter measured by the sensor indicates a shape of the patterning device. In some embodiments, the sensor is configured to measure a temperature of fluid in the volume between the patterning device and the lens of the projection system. In some embodiments, the sensor is configured to measure a temperature of a portion of the patterning device.

In some embodiments, a method for controlling a temperature of a patterning device includes flowing gas across a surface of the patterning device and adjusting a temperature of the gas based on a set point. The method also includes measuring a parameter indicative of an amount of heat added to at least one of (a) the patterning device and (b) a volume between the patterning device and a lens of a projection system during operational use of the lithographic system. The method further includes adjusting the set point based on the measured parameter. In some embodiments, measuring the parameter comprises measuring a parameter indicative of the shape of the patterning device. In some embodiments, measuring the parameter comprises measuring a temperature of fluid in the volume between the patterning device and the lens of the projection system. In some embodiments, measuring the parameter comprises measuring a temperature of a portion of the patterning device.

Further features and advantages of the embodiments, as well as the structure and operational of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

The features and advantages of the disclosed embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

The disclosed embodiment(s) merely exemplify the invention. The scope of the invention is not limited to the disclosed embodiment(s). The invention is defined by the claims appended hereto.

The embodiment(s) described, and references in the specification to "an example," "one embodiment," "an embodiment," "an example embodiment," "some embodiments," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of this disclosure may be implemented.

Example Reflective and Transmissive Lithographic Systems

Figure 1A:
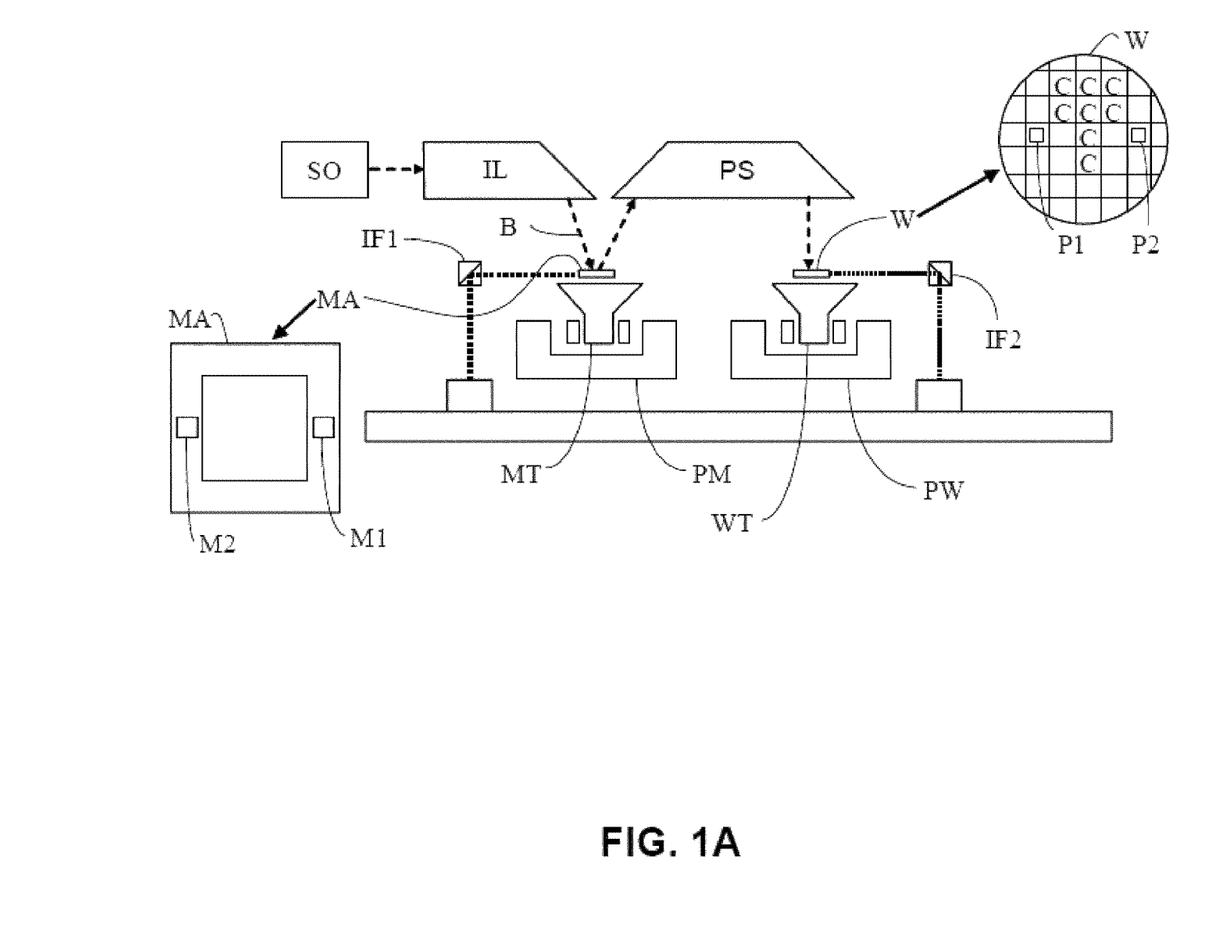
FIG. 1A is a schematic illustration of a reflective lithographic apparatus, according to an embodiment.
Figure 1B:
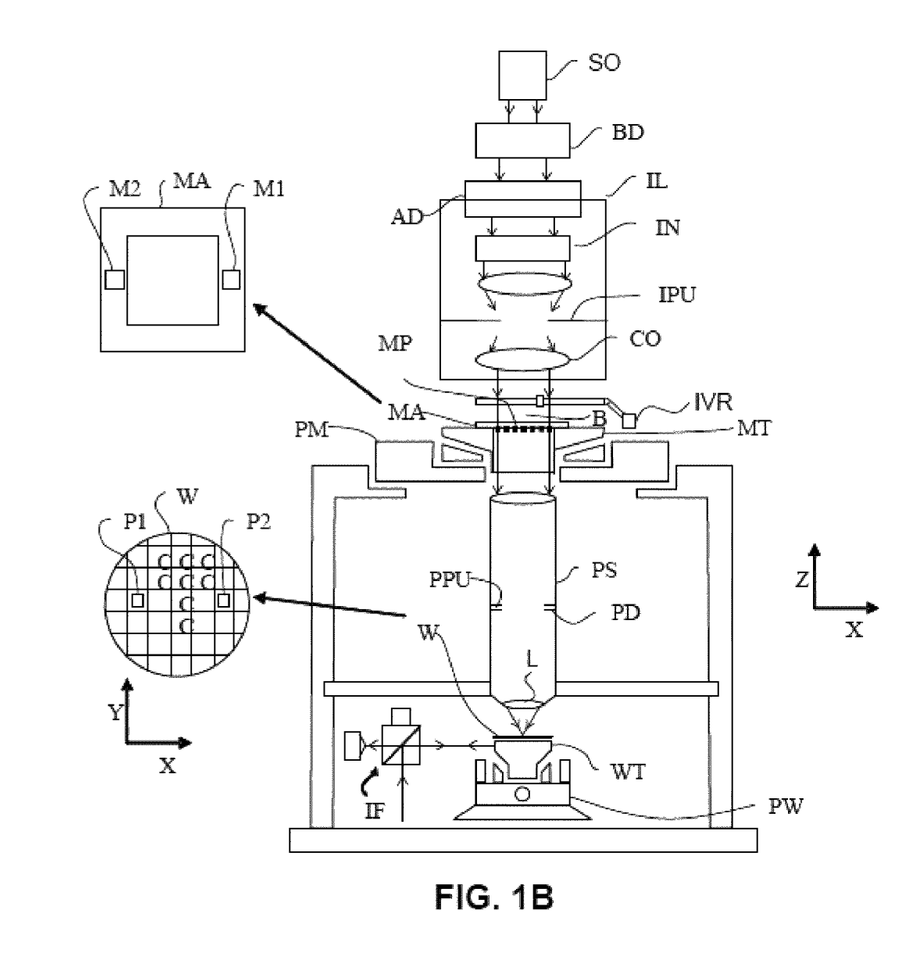
FIG. 1B is a schematic illustration of a transmissive lithographic, apparatus according to an embodiment.

FIGS. 1A and 1B are schematic illustrations of a lithographic apparatus 100 and lithographic apparatus 100', respectively, in which embodiments of this disclosure may be implemented. Lithographic apparatus 100 and lithographic apparatus 100' each include the following: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (for example, comprising part of one or more dies) C of the substrate W. In lithographic apparatus 100, the patterning device MA and the projection system PS are reflective. In lithographic apparatus 100', the patterning device MA and the projection system PS are transmissive. In some embodiments, the projection system PS is catadioptric.

The illumination system IL may include various types of optical components, such as refractive, reflective, magnetic, electromagnetic, electrostatic, or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operation, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operational can be readily applied to maskless lithography that utilizes a programmable patterning device, such as a programmable mirror array of a type as referred to herein.

Combinations and/or variations on the described modes of use or entirely different modes of use can also be employed.

Figure 2:
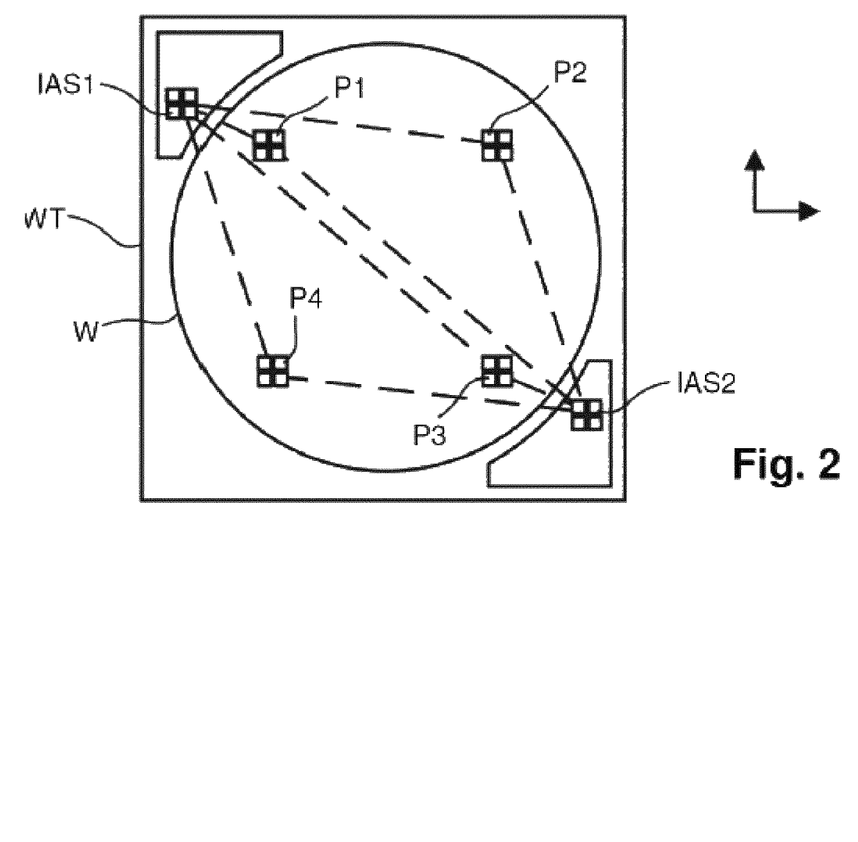
FIG. 2 is a schematic plan view of a substrate table and substrate according to an embodiment.

FIG. 2 schematically depicts an arrangement of substrate table WT depicted in the lithographic apparatuses of FIG. 1A or 1B, according to an embodiment in which substrate table WT includes an image sensor. In some embodiments, as shown in FIG. 2, substrate table WT includes two image sensors IAS1 and IAS2. Image sensors IAS1 and IAS2 can be used to determine a location of an aerial image of a pattern, e.g., an object mark, on mask MA by scanning the image sensor IAS1 or IAS2 through the aerial image. The relative position of object marks on the mask MA with respect to the wafer table WT can be deduced from information obtained with the image sensors IAS1, IAS2, and a number of parameters can be calculated from the measured positions of object marks on the mask MA. For example, such parameters of mask MA can include magnification of the MA (M), rotation about the z axis (R), translation along the x axis and the y axis of mask MA (Cx, Cy), magnification in the y direction (My), and scan skew (RI).

It must be understood that instead of two image sensors IAS1 and IAS2, more or fewer image sensors may be present, e.g. one or three. The form of these sensors and electronics is known to the skilled person and will not be described in further detail. Alternative forms of alignment mechanism are possible, and useful within the scope of the present invention. In other embodiments, it may be possible to dispense with image sensors IAS1, IAS2, or to provide them on a support separate from the wafer table which carries the substrate.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains one or multiple processed layers.

Although specific reference may have been made above to the use of embodiments in the context of optical lithography, it will be appreciated that the embodiments may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "lens," where the context allows, may refer to any one or combination of various types of optical components, including refractive, reflective, magnetic, electromagnetic and electrostatic optical components.

Exemplary Embodiments of a Lithographic Apparatus

Figure 3:
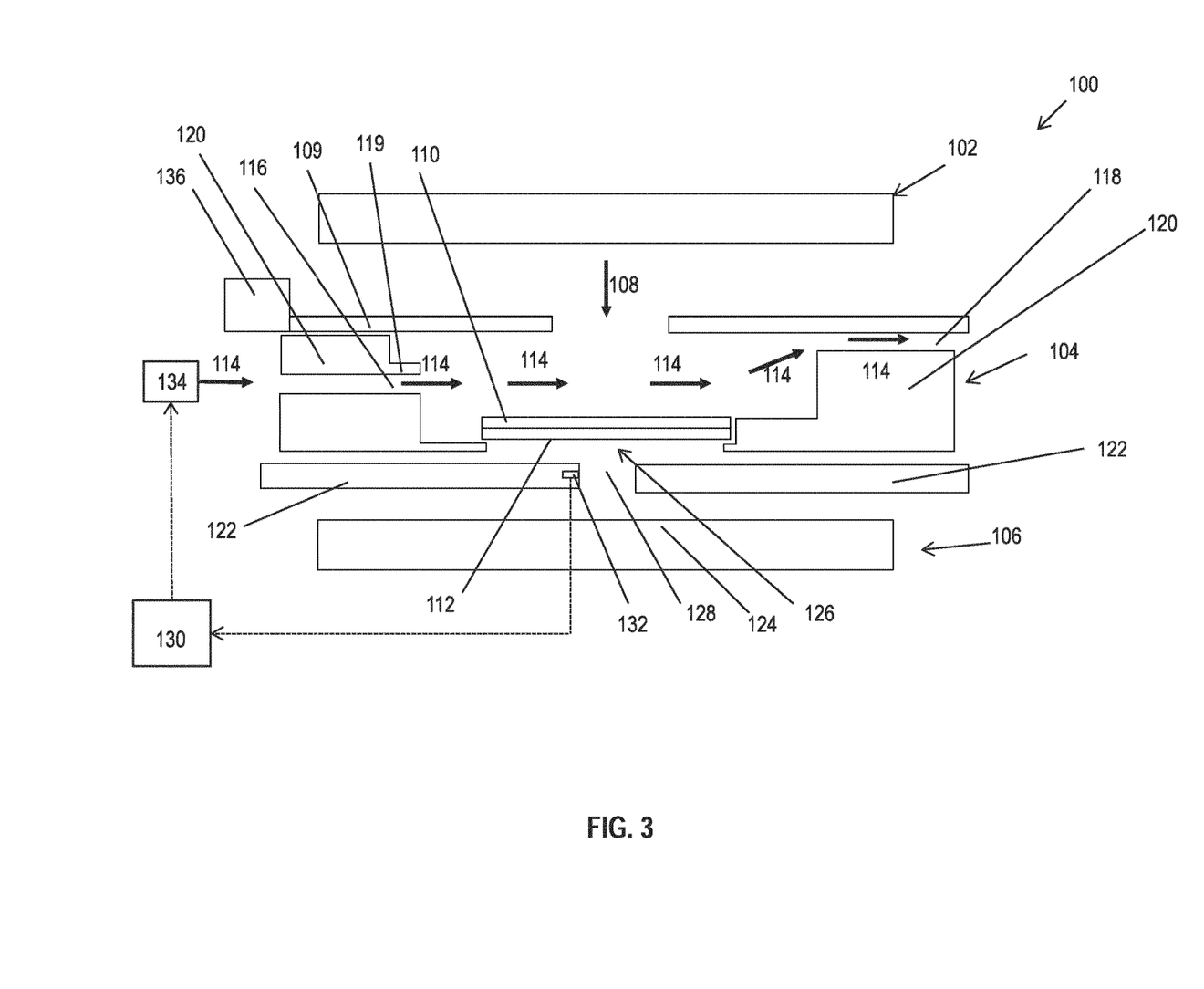
FIG. 3 is a schematic side view illustration of an illumination system, a support structure, and a projection system, according to an embodiment.

FIG. 3 is a schematic side view of a lithographic apparatus 100, including an illumination system 102, a support structure 104 configured to support a patterning device 110, and a projection system 106, according to an embodiment.

In some embodiments, lithographic apparatus 100 is similar to lithographic apparatus 100 and 100' in structure and function as described above with reference to FIGS. 1A and 1B. For example, lithographic apparatus 100 includes illumination system 102 that is configured to condition a radiation beam 108 (for example, DUV or EUV radiation) such as the radiation beam B discussed in FIGS. 1A and 1B above. Radiation beam 108 is directed on patterning device 110.

Lithographic apparatus 100 also includes support structure 104 (for example, a mask table MT as discussed in FIGS. 1A and 1B) that is configured to support patterning device 110 (for example, a mask, a reticle, or a dynamic patterning device). Support structure 104 is configured to hold patterning device 110 in a manner that depends on the orientation of patterning device 110. Support structure 104 can use mechanical, vacuum, electrostatic, or other clamping techniques to hold patterning device 110 to a support table 112 that directly supports patterning device 110. Support structure 104 can be configured to ensure that patterning device 110 is at a desired position, for example, with respect to projection system 106. For example, support structure 104 can include a movable component 120, such as short or long stroke module of a reticle stage, that is configured to accurately position patterning device 110 (e.g., along the x axis or the y axis).

In some embodiments, as shown in FIG. 3, lithographic apparatus 100 includes a fixed purge plate 109 between illumination system 102 and support structure 104. For example, fixed purge plate 109 can be about 1.5 mm above support table 112. Fixed purge plate 109 can define, in part, a pressurized environment that contains clean gas in the area between patterning device 110 and a bottom surface of fixed purge plate 109.

Projection system 106 (for example, projection system PS as discussed in FIGS. 1A and 1B) is configured to project a pattern imparted to radiation beam 108 by patterning device 110 onto a target portion (for example, part of one or more dies) of a substrate (not shown in FIG. 3). Projection system 106 includes a proximal lens element 124 that is adjacent support structure 104 in some embodiments.

As shown in FIG. 3, support structure 104 and projection system 106 define a volume 126 between support structure 104 and projection system 106, for example, directly between support table 112 of support structure 104 and proximal lens element 124 of projection system 106. In some embodiments, volume 126 provides a conditioned gas-environment through which imaging radiation 108 may travel from patterning device 110 to projection system 106. In some embodiments, lithographic apparatus includes a plate 122 that separates support structure 104 from projection system 106. For example, plate 122 can be positioned between support table 112 of support structure 104 and proximal lens element 124 of projection system 106. In some embodiments, plate 122 is configured as a purge plate. In some embodiments, volume 126 may have a continuous flow of gas that may be created by supplying gas from openings in plate 122 and extracting the supplied purge gas through openings on an opposing side of plate 122. Plate 122 defines an opening 128 that allows radiation beam 108 to pass from illumination system 102 to projection system 106. As radiation 108 is incident on, and passes through, patterning device 110, patterning device 110 absorbs energy from radiation 108, which can cause a temperature increase and an associated thermal expansion of patterning device 110 and cause a temperature increase of the gas in volume 126, which can lead to image distortion.

In some embodiments, lithographic apparatus 100 includes one or more gas inlets 116 and one or more gas outlets 118. Gas inlet(s) 116 and gas outlet(s) 118 are positioned and configured to generate a gas flow 114 that travels across a surface of patterning device 110, for example as shown in FIG. 3, a top surface of patterning device 110 that faces illumination system 102. Gas inlet(s) 116 introduce gas flow 114, and gas outlet(s) 118 extract gas flow 114. In some embodiments, gas flow 114 travels substantially parallel to the surface of patterning device 110 from gas inlet(s) 116 to gas outlet(s) 118. Gas outlet(s) 118 extract gas flow 114 as gas flow 114 reaches the opposite side of patterning device 110 from gas inlet(s) 116 in some embodiments. Extraction of gas flow 114 at gas outlet(s) 118 can be active or passive. In some embodiments, gas flow 114 comprises helium or consists essentially of helium. In some embodiments, gas flow 114 comprises an extremely clean dry gas or air. In some embodiments, gas flow 114 can be temporarily and selectively stopped while patterning device 110 is loaded on or unloaded from support structure 104 to avoid disturbing the loading process. In some embodiments, gas flow 114 can be temporarily and selectively stopped when no cooling of patterning device 110 is required.

In some embodiments, as shown in FIG. 3, gas inlet(s) 116 and gas outlet(s) 118 are positioned between illumination system 102 and patterning device 110. For example, in some embodiments, support structure 104 includes gas inlet(s) 116 on one side of support structure 104. Gas inlet(s) 116 can be integral with movable component 120 in some embodiments. For example, as shown in FIG. 3, movable component 120 includes a nozzle 119 that defines gas inlet(s) 116. In other embodiments (not shown in FIG. 3), gas inlet(s) 116 can be separate from movable component 120, for example, a separate nozzle that passes through an opening defined by movable component 120. In other embodiments, gas inlet(s) 116 can be defined by fixed purge plate 109. In some embodiments, gas inlet(s) 116 are near an end of patterning device 110. In some embodiments, gas inlet(s) 116 are configured such that gas inlet(s) 116 move with patterning device 110 during operational use of lithographic apparatus 100.

In some embodiments (not shown in FIG. 3), movable component 120 includes gas outlet(s) 118. For example, gas outlet(s) 118 can be integral with movable component 120, or gas outlet(s) 118 can be separate from movable component 120, for example, a separate nozzle that passes through an opening defined by movable component 120. Gas outlet(s) 118 can be positioned at an opposing side of patterning device 110 relative to gas inlet(s) 116. Gas outlet(s) 118 can be adjacent an end of patterning device 110 opposite from the end of patterning device 110 at which gas inlet(s) 116 are adjacent. In some embodiments, gas outlet(s) 118 are defined by fixed purge plate 109. And in some embodiments, as shown in FIG. 3, fixed purge plate 109 and movable component 120, collectively define, at least in part, gas outlet(s) 118. Gas inlet(s) 116 and gas outlet(s) 118 can each be positioned to be in close proximity, for example, adjacent to the same surface of patterning device 110, for example, a top surface of patterning device 110.

In some embodiments (not shown), gas inlet(s) 116 and gas outlet(s) 118 are between patterning device 110 and projection system 106. In such embodiments, gas inlet(s) 116 and gas outlet(s) 118 can be positioned to cause gas flow 114 to flow across a bottom surface of patterning device 110 that faces projection system 106.

In some embodiments (not shown), lithographic apparatus 100 can include gas inlet(s) 116 in close proximity to the top surface of patterning device 110 and one or more additional gas inlets in close proximity to the bottom surface of patterning device 110, with corresponding gas outlets in close proximity to the top and bottom surfaces of patterning device 110. This configuration creates dual parallel flows of gas across the top and bottom surfaces of patterning device 110.

In some embodiments, patterning device 110 is a reflective patterning device, as discussed with respect to FIG. 1A above (not shown in FIG. 3). Radiation beam 108 is still incident on patterning device 110 but would be reflected from patterning device 110. In such circumstances, patterning device 110 may still be subject to heating and degrading effects from the resulting thermal expansion of patterning device 110 and the heating of the gas around patterning device 110. Support structure 104 can still comprise gas inlet(s) 116 and gas outlet(s) 118 positioned within close proximity to a surface of patterning device 110, as discussed above.

In some embodiments, as explained below, gas flow 114 may be extracted by gas outlet(s) 118 and recirculated back to gas inlet(s) 116.

Gas flow 114 conditions, for example, changes or maintains, the temperature of patterning device 110. For example, gas flow 114 can reduce, increase, or maintain the temperature of patterning device 110. In some embodiments, gas flow 114 counters heating of patterning device 110 caused by absorption of radiation 108, which reduces the thermal expansion of patterning device 110 and heating of the fluid around patterning device 110, including the fluid in volume 126. This reduction in thermal expansion of patterning device 110 and in the temperature of the fluid around patterning device 110, including the fluid in volume 126, reduces image distortion at the substrate. In some embodiments, gas flow 114 maintains patterning device 110 at or near 22° C. at atmospheric pressure. Skilled artisans will appreciate that other target temperatures are possible and/or may be more desirable for a given application.

Turning again to FIG. 3, lithographic apparatus 100 can include at least one temperature conditioning device 134 in some embodiments. Temperature conditioning device 134 can be, for example, one or more heaters (e.g., a piezoelectric heater) or one or more cooling devices (e.g., a heat exchanger such as a Peltier device). In some embodiments, lithographic apparatus 100 can include both a heater and cooling device. In some embodiments, temperature conditioning device 134 is configured to maintain and dynamically change the temperature of gas flow 114 based on a set point received from, for example, a controller 130 described further below. In some embodiments, temperature conditioning device 134 positioned at support structure 104. For example, temperature conditioning device 134 can be positioned at nozzle 119 of movable component 120 such that temperature conditioning device 134 maintains or changes the temperature of gas flow 114 as it exits nozzle 119. Temperature conditioning device 134 can be located at other locations, for example, at any other locations upstream of gas inlet(s) 116. In some embodiments, temperature conditioning device 134 is configured to dynamically condition gas flow 114 to have a temperature ranging from about 19° C. to about 25° C. based on a received set point signal. For example, in some embodiments, temperature conditioning device 134 is configured to dynamically condition gas flow 114 to have any temperature ranging from about 22° C. to about 21° C. based on a received set point signal. For example, in some embodiments, temperature conditioning device 134 is configured to condition gas flow 114 to have a temperature ranging from about 21.8° C. to about 21.2° C. based on a received set point signal.

In some embodiments, lithographic apparatus 100 also includes at least one sensor configured to measure, during operational use of lithographic apparatus 100, a parameter indicative of an amount of heat added to at least one of (1) patterning device 110 and (2) volume 126 between support structure 104 and projection system 106.

In FIG. 3, for example, lithographic apparatus 100 includes a sensor configured to measure, during operational use of lithographic apparatus 100, a parameter indicative of an amount of heat added to volume 126 between support structure 104 and projection system 106. As shown in FIG. 3, lithographic apparatus 100 includes a temperature sensor 132 positioned between support structure 104 and projection system 106, for example, under patterning device 110 and over proximal lens element 124 of projection system 106, that measures the temperature of the fluid in volume 126. As shown in FIG. 3, sensor 132 is coupled to plate 122 and positioned adjacent opening 128 defined by plate 122.

Figure 4:
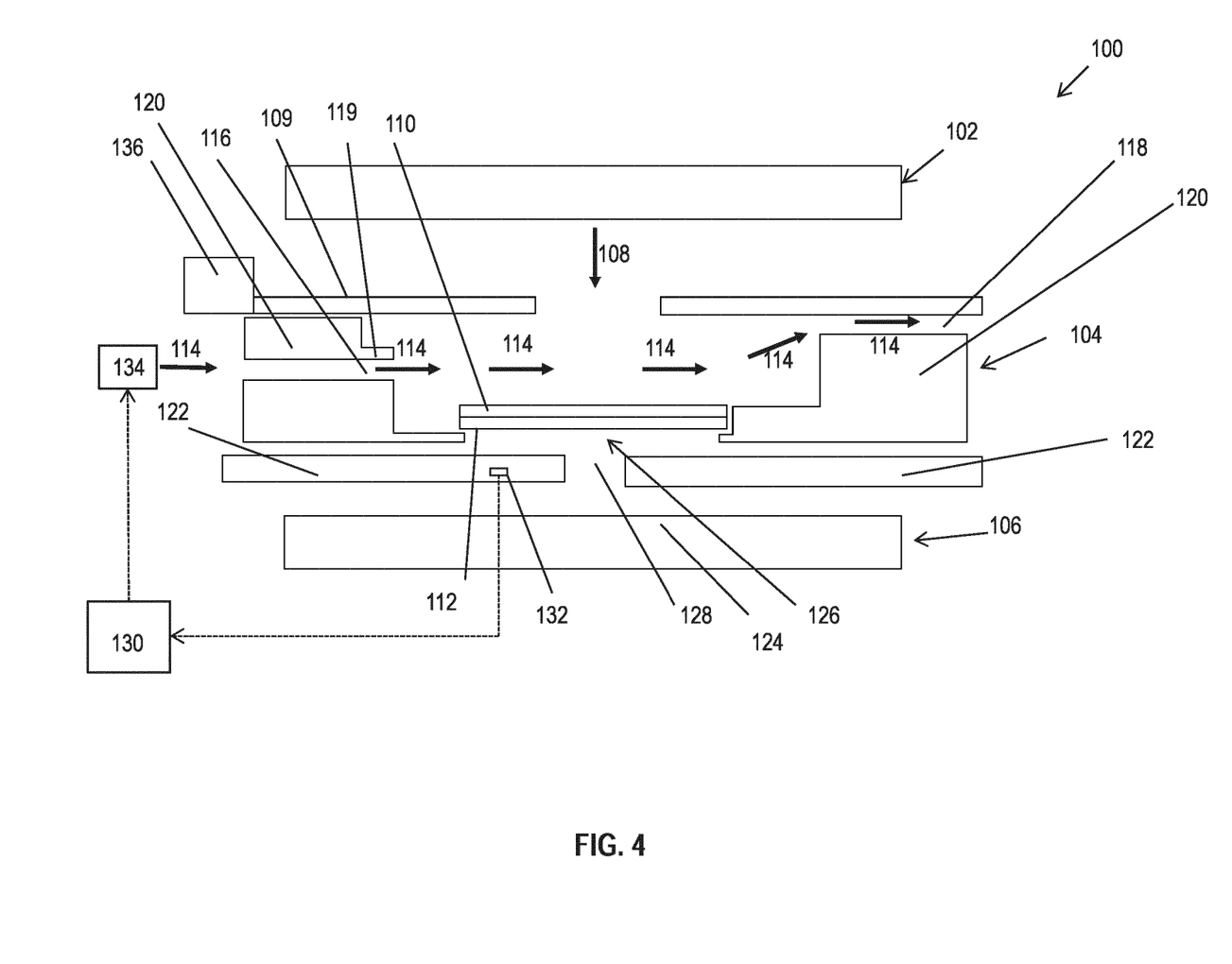
FIG. 4 is a schematic side view illustration of an illumination system, a support structure, and a projection system, according to another embodiment.

FIG. 4 illustrates an illumination system, a support structure, and a projection system, according to another embodiment. Illustrated is another exemplary placement of a sensor configured to measure, during operational use of lithographic apparatus 100, a parameter indicative of an amount of heat added to at least one of (1) patterning device 110 and (2) volume 126 between support structure 104 and projection system 106. For example, as shown in FIG. 4, a sensor 132 is coupled to plate 122 but positioned away from opening 128 defined by plate 122.

In some embodiments, lithographic apparatus 100 can include at least two sensors 132, for example, one sensor 132 positioned as shown in FIG. 3 and another sensor 132 positioned as shown in FIG. 4.

In other embodiments, lithographic apparatus 100 can include one or more sensors 132 positioned at any other suitable location for measuring the temperature of the fluid in volume 126.

Figure 5:
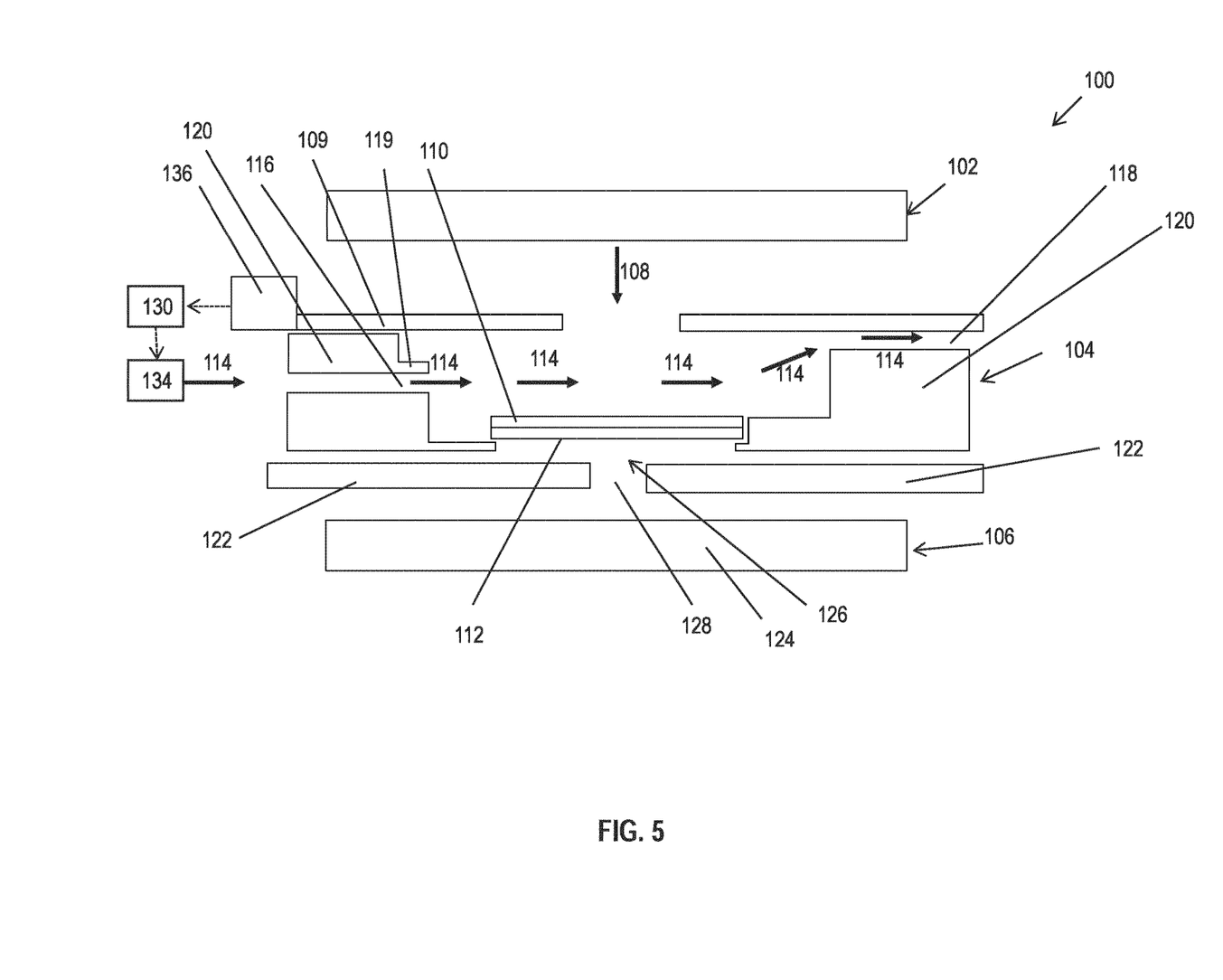
FIG. 5 is a schematic side view illustration of an illumination system, a support structure, and a projection system, according to yet another embodiment.

FIG. 5 illustrates an illumination system, a support structure, and a projection system, according to another embodiment. Illustrated is another exemplary placement of a sensor configured to measure, during operational use of lithographic apparatus 100, a parameter indicative of an amount of heat added to at least patterning device 110. For example, as shown in FIG. 5, lithographic apparatus 100 includes a sensor 136 configured to measure a temperature of at least a portion of patterning device 110, for example, a surface portion of patterning device 110 facing away from volume 126 and toward illumination system 102. In such embodiments, sensor 136 can be positioned between illumination system 102 and support structure 104. In such embodiments, sensor 136 can be, for example, an infrared temperature sensor.

In some embodiments, the measured parameter indicative of an amount of heat added to at least one of patterning device 110 and volume 126 between support structure 104 and projection system 106 is a parameter that indicates the shape of patterning device 110. For example, in some embodiments, lithographic apparatus 100 includes at least one image sensor (for example, image sensors IAS1 and IAS2 as discussed in FIG. 2) that measures an alignment parameter of patterning device 110, for example, a sensor that measures the magnification of patterning device 110 (M), rotation about the z-axis (R), translation along the x-axis or the y-axis (Cx, Cy), magnification along the y-axis (My), and scan screw (RI). Based on the measured alignment parameter(s), controller 130 can determine the shape of patterning device 110, and based on the determined shape of patterning device 110, controller 130 can determine the temperature profile of patterning device 110 or volume 126 between support structure 104 and projection system 106.

In some embodiments, lithographic apparatus includes at least one sensor 132 as shown in FIG. 3, at least one sensor 132 as shown in FIG. 4, at least one sensor 136 as shown in FIG. 5, at least sensor (for example, image sensors IAS1 and IAS2 as discussed in FIG. 2) that measures an alignment parameter of patterning device 110, or any combination thereof.

Figure 6:
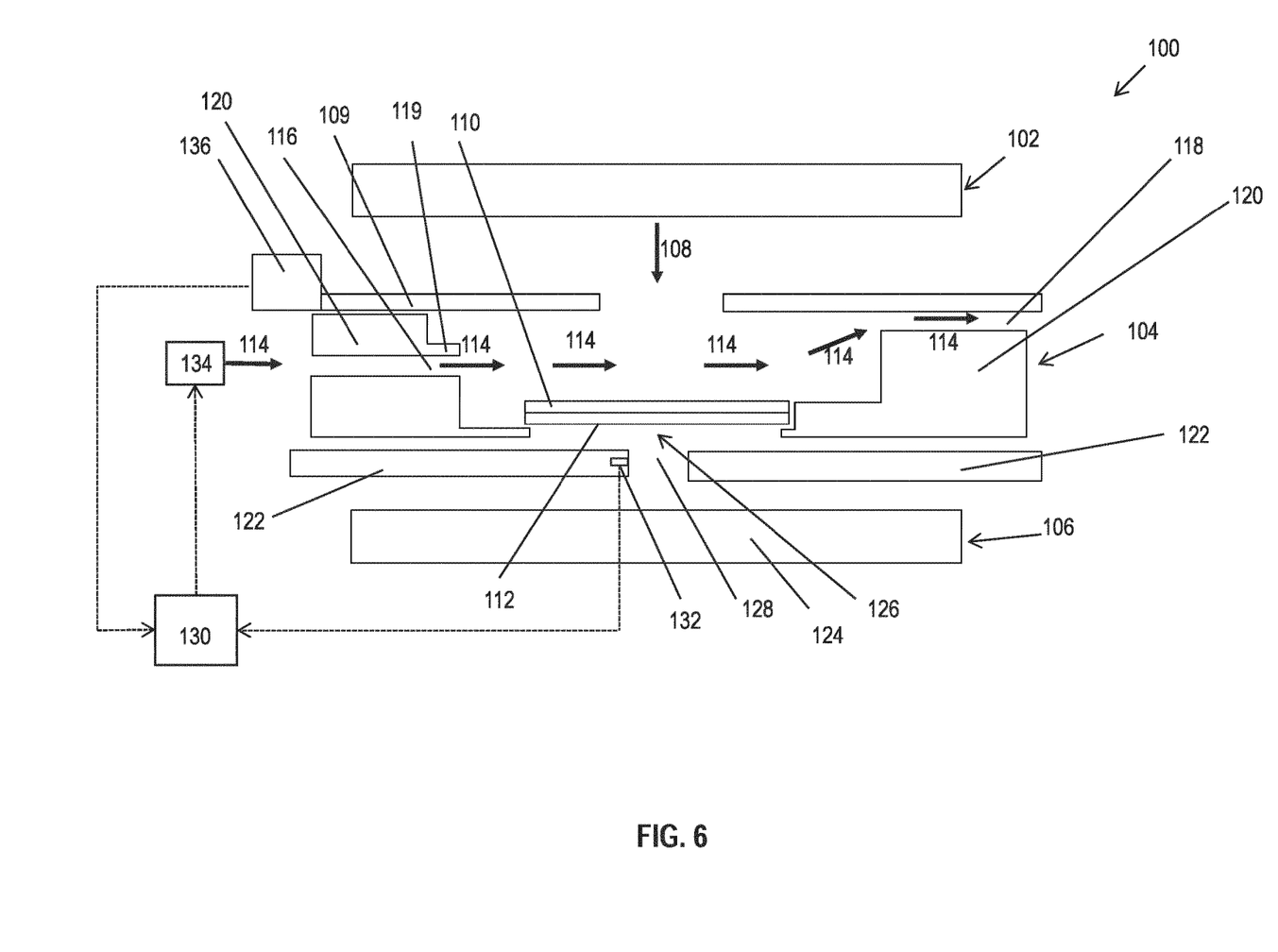
FIG. 6 is a schematic side view illustration of an illumination system, a support structure, and a projection system, according to another embodiment.

Lithographic apparatus 100 can also include a controller 130, for example, a processor, configured to receive signals from the one or more sensors (for example, sensor 132 in FIG. 3, sensor 132 as shown in FIG. 4, sensor 136 as shown in FIG. 5, or alignment parameter sensor). Such received sensor signals are indicative of the measured parameter (for example, temperature of volume 126 or patterning device 110) that indicates of an amount of heat added to at least one of (1) patterning device 110 and (2) volume 126 between support structure 104 and projection system 106. In some embodiments, controller 130 is configured to receive signals from two or more of (1) at least one sensor 132 as shown in FIG. 3, (2) at least one sensor 132 as shown in FIG. 4, (3) at least one sensor 136 as shown in FIG. 5, and (4) at least sensor (for example, image sensors IAS1 and IAS2 as discussed in FIG. 2) that measures an alignment parameter of patterning device 110. For example, FIG. 6 illustrates an illumination system, a support structure, and a projection system, according to another embodiment, in controller 130 coupled with a sensor 132 as described in FIG. 3 and a sensor 136 as described in FIG. 5.

In some embodiments, based on the signals received from the one or more sensors, controller 130 is configured to calculate at least one of (1) a temperature profile of patterning device 110 and (2) a temperature profile of volume 126. In some embodiments, controller 130 is configured to compare the calculated temperature profile to a desired temperature profile for patterning device 110 or volume 126, and based on this comparison, controller 130 maintains or dynamically changes a set point temperature for temperature conditioning device 134. The desired temperature profile of patterning device 110 or volume 126 can be uniform or non-uniform.

For example, if the calculated temperature profile is higher than the desired temperature profile, controller 130 may lower the temperature set point for temperature conditioning device 134 to achieve the desired temperature profile for patterning device 110 or volume 126. If the calculated temperature profile is lower than the desired temperature profile, controller 130 may raise the temperature set point for temperature conditioning device 134 to achieve the desired temperature profile for patterning device 110 or volume 126. If the calculated temperature profile is equal to the desired temperature profile, controller 130 may maintain the set point for temperature conditioning device 134 to maintain the desired temperature profile for patterning device 110 or volume 126. In some embodiments, the desired temperature profile for patterning device 110 or volume 126 is based on the operational status of lithographic apparatus 100. For example, the desired temperature profile for patterning device 110 or volume 126 may be higher while patterning device 110 is being aligned than when patterning device 110 is being exposed.

Controller 130 is operatively coupled, directly or indirectly, to temperature conditioning device 134 such that temperature conditioning device 134 receives a temperature set point signal indicative of the temperature set point determined by controller 130. Based on the received temperature set point, temperature conditioning device 134 can dynamically adjust the temperature of gas flow 114.

Figure 7:
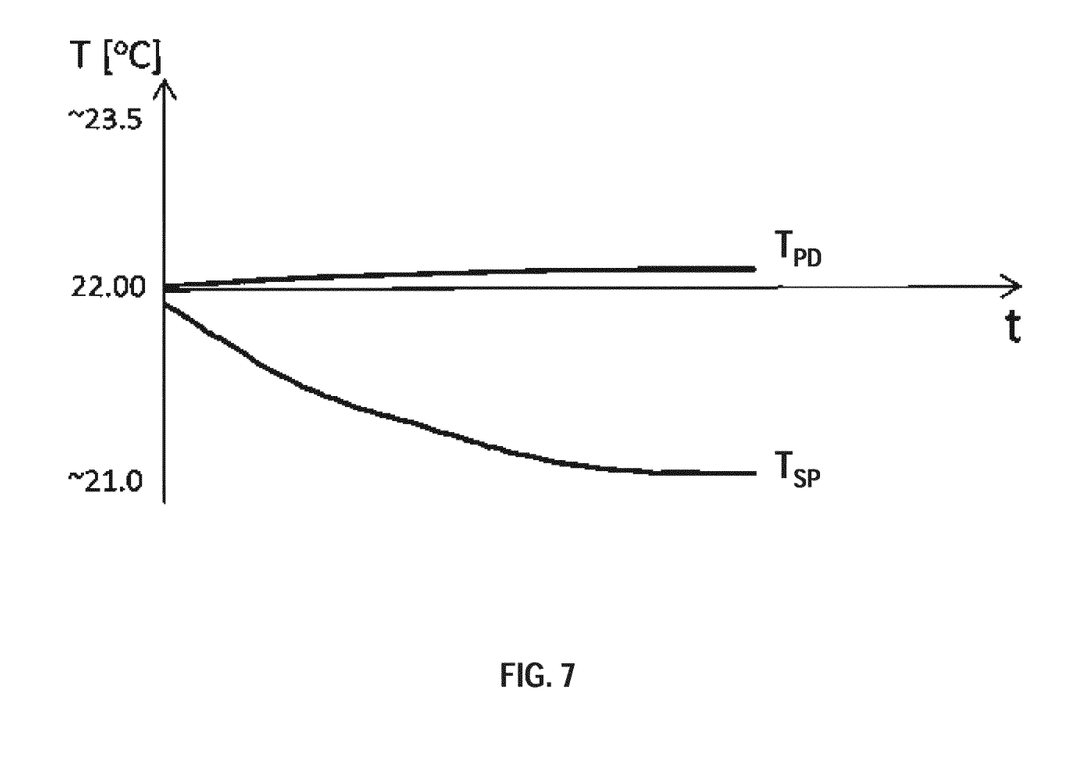
FIG. 7 is a chart illustrating a set point temperature of a gas flow and a temperature of a patterning device over time according to an embodiment.

In some embodiments, controller 130 adaptively adjusts the set point temperature to achieve a constant or substantially constant temperature profile of patterning device 110 or volume 126 in the presence of time varying heat loads generated by radiation 108. For example, when the temperature of patterning device 110 is about equal to the ambient system temperature, controller 130 can adjust the set point for temperature conditioning device 134 to equal about the ambient system temperature, for example, about 21.8° C. Controller 130 can gradually reduce the set point for temperature conditioning device 134 during exposures. In some embodiments, the set point can be lowered to a temperature as low as about 19° C. In other embodiments, the set point can be lowered to a temperature of about 21.2° C. For example, FIG. 7 illustrates how controller 130 can reduce the set point for temperature conditioning device 134 ($T_{SP}$) over time during exposures to achieve a substantially constant temperature of patterning device 110 or volume 126 ($T_{PD}$) in the presence of time varying heat loads generated by radiation 108.

Exemplary Embodiments of Methods of Controlling the Temperature of a Patterning Device Exemplary methods for controlling the temperature of a patterning device according to various embodiments will now be described. It is to be appreciated that operations explained below may be performed in any order, and that not all operations described may be needed. To start, patterning device 110 is illuminated with radiation beam 108. Gas flow 114 is supplied across a surface of patterning device 110, for example, a top or bottom surface. Gas flow 114 conditions (for example, maintains or changes) the temperature of patterning device 110, for example, because gas flow 114 is at a lower temperature. The temperature of gas flow 114 can be dynamically adjusted to variably affect the temperature of patterning device 110 by adaptively adjusting the set point received by temperature conditioning device 134. Gas flow 114 is extracted from the surface of patterning device 110. In some embodiments, gas flow 114 is continually supplied while lithographic apparatus 100 is in operation. In some embodiments, gas flow 114 is continually supplied while lithographic apparatus 100 is in operation such that the temperature of patterning device 110 or volume 126 is constantly maintained. In some embodiments, the temperature of patterning device 110 is maintained at or about a target temperature, for example, 21.8° C.

Figure 8:
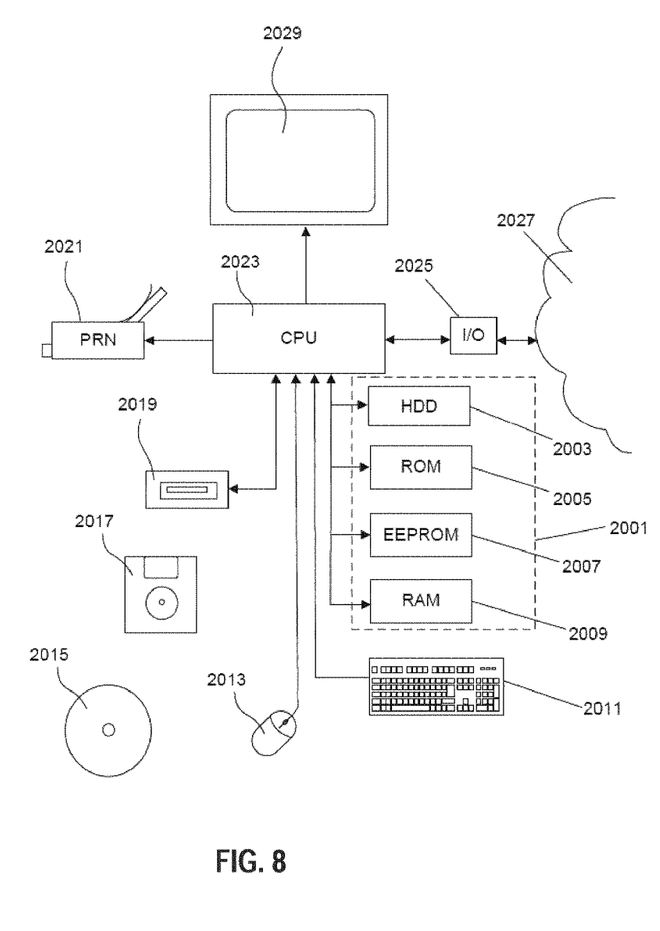
FIG. 8 illustrates computer system hardware useful in implementing the embodiments discussed in FIGS. 1A through 7.

FIG. 8 illustrates computer system hardware useful in implementing the embodiments discussed in FIGS. 1A through 7. FIG. 8 illustrates a computer assembly useful as a processor configured to receive data from the one or more sensors configured to measure a parameter indicative of an amount of heat added to at least one of (1) patterning device 110 and (2) volume 126 between support structure 104 and projection system 106, and determine how to adaptively adjust the set point for temperature conditioning device 134 to change or maintain the temperature profile of patterning device 110. The computer assembly may be a dedicated computer in the form of a control unit in embodiments of the assembly or, alternatively, be a central computer controlling the lithographic projection apparatus. The computer assembly may be arranged for loading a computer program product comprising computer executable code.

A memory 2001 connected to a processor 2023 may comprise a number of memory components like a hard disk drive (HDD) 2003, Read Only Memory (ROM) 2005, Electrically Erasable Programmable Read Only Memory (EEPROM) 2007 and Random Access Memory (RAM) 2009. Not all aforementioned memory components need to be present. Furthermore, it is not essential that aforementioned memory components are physically in close proximity to the processor 2023 or to each other. They may be located at a distance away from each other.

The processor 2023 may also be connected to some kind of user interface, for instance a keyboard 2011 or a mouse 2013. A touch screen, track ball, speech converter or other interfaces that are known to persons skilled in the art may also be used.

The processor 2023 may be connected to a reading unit 2019, which is arranged to read data, e.g., in the form of computer executable code, from and under some circumstances store data on a data carrier, like a floppy disc 2017 or an optical disk 2015. DVDs, flash memory, or other data carriers known to persons skilled in the art may also be used.

The processor 2023 may also be connected to a printer 2021 to print out output data on paper as well as to a display 2029, for instance a monitor or LCD (Liquid Crystal Display), or any other type of display known to a person skilled in the art.

The processor 2023 may be connected to a communications network 2027, for instance a public switched telephone network (PSTN), a local area network (LAN), a wide area network (WAN) etc. by means of transmitters/receivers 2025 responsible for input/output (I/O). The processor 2023 may be arranged to communicate with other communication systems via the communications network 2027. In an embodiment, external computers (not shown), for instance personal computers of operators, can log into the processor 2023 via the communications network 2027.

The processor 2023 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 2023 may even be located a distance away from the other processing units and communicate via communications network 2027. Connections between modules can be made wired or wireless.

The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that the embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

The term "in substantial contact" as used herein generally describes elements or structures that are in physical contact with each other with only a slight separation from each other which typically results from misalignment tolerances. It should be understood that relative spatial descriptions between one or more particular features, structures, or characteristics (e.g., "vertically aligned," "substantial contact," etc.) used herein are for purposes of illustration only, and that practical implementations of the structures described herein may include misalignment tolerances without departing from the spirit and scope of the present disclosure.

While specific embodiments have been described above, it will be appreciated that the embodiments may be practiced otherwise than as described. The description is not intended to limit the invention.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the present invention and the appended claims in any way.

The embodiments have described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
   a patterning device support structure configured to support a patterning device;
   a gas inlet configured to provide a gas flow across a surface of the patterning device;
   a temperature conditioning device configured to condition the temperature of the gas flow based on a set point;
   a sensor configured to measure a parameter indicative of an amount of heat added to at least one of (a) the patterning device and (b) a volume between the patterning device and a lens of a projection system during operational use of the lithographic system, wherein the sensor is located adjacent to the volume; and
   a controller operatively coupled to the sensor and configured to adjust the set point based on the parameter measured by the sensor to control a temperature of the patterning device, wherein the parameter measured by the sensor indicates a shape of the patterning device.

2. The lithographic apparatus of claim 1, wherein the parameter measured by the sensor is a patterning device alignment parameter.

3. The lithographic apparatus of claim 2, wherein the patterning device alignment parameter is a magnification parameter.

4. The lithographic apparatus of claim 1, wherein the sensor is an optical sensor.

5. The lithographic apparatus of claim 1, wherein the controller is configured to calculate, based on the shape of the patterning device, at least one of a temperature profile of the patterning device and a temperature profile of the volume between the patterning device and the lens of the projection system.

6. The lithographic apparatus of claim 1, wherein the sensor is configured to measure a temperature of fluid in the volume between the patterning device and the lens of the projection system.

7. The lithographic apparatus of claim 6, wherein the sensor is coupled to a plate separating the patterning device from the lens of the projection system.

8. The lithographic apparatus of claim 1, wherein the sensor is configured to measure a temperature of a portion of the patterning device.

9. The lithographic apparatus of claim 8, wherein the portion of the patterning device is a surface of the patterning device facing away from the volume between the patterning device and a lens of a projection system.

10. The lithographic apparatus of claim 1; wherein the temperature conditioning device comprises a heater.

11. The lithographic apparatus of claim 1, wherein the temperature conditioning device comprises a cooling device.

12. The lithographic apparatus of claim 11, wherein the cooling device comprises a Peltier device.

13. A method for controlling a temperature of a patterning device, comprising:
    flowing gas across a surface of the patterning device;
    adjusting a temperature of the gas based on a set point;
    measuring a parameter indicative of an amount of heat added to at least one of (a) the patterning device and (b) a volume between the patterning device and a lens of a projection system during operational use of the lithographic system, wherein the sensor is located adjacent to the volume and the parameter measured by the sensor indicates a shape of the patterning device; and
    adjusting the set point based on the parameter.

14. The method of claim 13, wherein the parameter is a patterning device alignment parameter.

15. The method of claim 14, wherein the patterning device alignment parameter is a magnification parameter.

16. The method of claim 13, further comprising:
    calculating, based on the shape of the patterning device, at least one of a temperature profile of the patterning device and a temperature profile of the volume between the patterning device and the lens of the projection system,
    wherein the adjusting the set point based on the parameter comprises adjusting the set point based on the calculated at least one of a temperature profile of the patterning device and a temperature profile of the volume between the patterning device and the lens of the projection system.

17. The method of claim 13, wherein the measuring the parameter comprises measuring a temperature of fluid in the volume between the patterning device and the lens of the projection system.

18. The method of claim 17, further comprising:
    calculating, based on the temperature of fluid in the volume between the patterning device and the lens of the projection system, at least one of a temperature profile of the patterning device and a temperature profile of the volume between the patterning device and the lens of the projection system,
    wherein the adjusting the set point based on the parameter comprises adjusting the set point based on the calculated at least one of a temperature profile of the patterning device and a temperature profile of the volume between the patterning device and the lens of the projection system.

* * * * *